United States Patent
Shida et al.

(10) Patent No.: US 8,119,517 B2
(45) Date of Patent: Feb. 21, 2012

(54) CHEMICAL MECHANICAL POLISHING METHOD AND METHOD OF MANUFACTURING SEMICONDUCTOR DEVICE

(75) Inventors: Hirotaka Shida, Yokkaichi (JP); Yukiteru Matsui, Yokohama (JP); Atsushi Shigeta, Fujisawa (JP); Shinichi Hirasawa, Kita-ku (JP); Hirokazu Kato, Zushi (JP); Masako Kinoshita, Yokohama (JP); Takeshi Nishioka, Yokohama (JP); Hiroyuki Yano, Yokohama (JP)

(73) Assignees: JSR Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 12/477,332

(22) Filed: Jun. 3, 2009

(65) Prior Publication Data

US 2009/0239373 A1 Sep. 24, 2009

Related U.S. Application Data

(62) Division of application No. 11/563,414, filed on Nov. 27, 2006, now abandoned.

(30) Foreign Application Priority Data

Nov. 30, 2005 (JP) ................................. 2005-345790

(51) Int. Cl.
*H01L 21/4763* (2006.01)
*H01L 21/461* (2006.01)

(52) U.S. Cl. .... 438/623; 438/692; 438/693; 257/E21.23

(58) Field of Classification Search .................. 438/623, 438/692, 693; 257/E21.23
See application file for complete search history.

(56) References Cited

U.S. PATENT DOCUMENTS

| | | | |
|---|---|---|---|
| 5,597,786 A | 1/1997 | Itoh et al. | |
| 6,312,321 B1 | 11/2001 | Fukushima et al. | |
| 6,582,761 B1 | 6/2003 | Nishimoto et al. | |
| 6,740,590 B1 | 5/2004 | Yano et al. | |
| 7,049,221 B2 | 5/2006 | Deguchi | |
| 7,211,519 B2 * | 5/2007 | Takigawa et al. | 438/736 |
| 2003/0020176 A1 | 1/2003 | Nambu | |
| 2003/0089990 A1 * | 5/2003 | Usami | 257/758 |
| 2004/0132305 A1 | 7/2004 | Nishimoto et al. | |
| 2004/0137711 A1 * | 7/2004 | Deguchi | 438/622 |
| 2004/0198037 A1 * | 10/2004 | Iba | 438/634 |
| 2004/0253822 A1 | 12/2004 | Matsui et al. | |
| 2005/0050803 A1 | 3/2005 | Amanokura et al. | |
| 2005/0266355 A1 * | 12/2005 | Matsui et al. | 430/323 |
| 2007/0232197 A1 | 10/2007 | Amanokura et al. | |

(Continued)

FOREIGN PATENT DOCUMENTS

JP  2003-045964  2/2003

(Continued)

OTHER PUBLICATIONS

Notification of Reasons for Refusal, dispatched on Aug. 10, 2011, by Japan Patent Office, Dispatch No. 096626 (English Translation Attached).

*Primary Examiner* — Kevin Parendo

(74) *Attorney, Agent, or Firm* — Oblon, Spivak, McClelland, Maier & Neustadt, L.L.P.

(57) ABSTRACT

A chemical mechanical polishing method comprises polishing an organic film using a slurry including polymer particles having a surface functional group and a water-soluble polymer.

15 Claims, 8 Drawing Sheets

U.S. PATENT DOCUMENTS

2009/0156007 A1  6/2009  Amanokura et al.

FOREIGN PATENT DOCUMENTS

| | | |
|---|---|---|
| JP | 2003-297920 | 10/2003 |
| JP | 2004-152997 | 5/2004 |
| JP | 2004-335978 | 11/2004 |
| JP | 2005-268409 | 9/2005 |
| JP | 2006-19696 | 1/2006 |
| WO | WO 03/038883 A1 | 5/2003 |

* cited by examiner

CHEMICAL MECHANICAL POLISHING METHOD AND METHOD OF MANUFACTURING SEMICONDUCTOR DEVICE

This application is a Divisional application of U.S. application Ser. No. 11/563,414, filed Nov. 27, 2006. Japanese Patent Application No. 2005-345790 filed Nov. 30, 2005, is hereby incorporated by reference in its entirety.

BACKGROUND OF THE INVENTION

The present invention relates to a chemical mechanical polishing method and a method of manufacturing a semiconductor device.

In the manufacturing process of semiconductor devices, a resist film is used to form a desired structure. The resist film is required to have a uniform thickness over the entire wafer. For example, a desired structure is obtained by forming a trench in a semiconductor substrate or a hole in an insulating film, applying a photoresist to form a resist film, and recessing or removing the resist film.

In this case, the resist film is required to have a uniform thickness over the entire wafer.

A variation in thickness of the resist film is increased during the subsequent recess step to cause the device shape to deteriorate. Moreover, a decrease in depth of focus or yield occurs.

In order to solve the problems caused by such a variation in thickness of the resist film, a method has been proposed in which the resist film is planarized by chemical mechanical polishing (CMP) after applying the resist (e.g. JP-A-2004-363191).

However, it is difficult to suppress dishing which occurs during planarization. Moreover, wafer in-plane uniformity is poor. When dishing in-plane uniformity is poor, the recess depth varies in the subsequent step. This makes it difficult to uniformly obtain a desired shape on the wafer surface, whereby a pattern dimensional variation occurs.

When polishing a resist film of which the hardness is increased by baking at a high temperature, inorganic particles such as silica or alumina are used as abrasive particles in order to ensure a practical process margin and productivity. In this case, since the inorganic particles tend to remain in the trench, the surface state deteriorates due to occurrence of scratches. Moreover, a problem occurs in which the residual particles serve as a mask during the recess step after CMP.

SUMMARY

An object of the invention is to provide a chemical mechanical polishing method capable of significantly improving a pattern dimensional variation and yield.

Another object of the invention is to provide a method of manufacturing a semiconductor device with high yield using a method of planarizing an organic film with excellent flatness and few defects.

A chemical mechanical polishing method according to one aspect of the invention comprises polishing an organic film using a slurry including polymer particles having a surface functional group and a water-soluble polymer.

In the above chemical mechanical polishing method, the surface functional group may be at least one functional group selected from the group consisting of an anionic functional group, a cationic functional group, an ampholytic functional group, and a nonionic functional group.

In the above chemical mechanical polishing method, the polymer particles may comprise at least one resin selected from the group consisting of an acrylic resin, a polystyrene resin, a urea resin, a melamine resin, a polyacetal resin, a polycarbonate resin, and a composite of these resins.

In the above chemical mechanical polishing method, the surface functional group may be a carboxyl group.

In the above chemical mechanical polishing method, a molecular weight of the water-soluble polymer may be 500 to 1,000,000.

A method of manufacturing a semiconductor device according to one aspect of the invention comprises:
 forming an insulating film on a substrate;
 forming a depression in the insulating film;
 forming a lower-layer film, an intermediate layer, and a resist film in that order on the insulating film in which the depression is formed; and
 subjecting the resist film to pattern exposure;
 forming the lower-layer film including:
 forming an organic film on the insulating film in which the depression is formed so that the depression is filled with the organic film; and
 chemically and mechanically polishing the organic film using a slurry including polymer particles having a surface functional group and a water-soluble polymer to planarize the organic film.

A method of manufacturing a semiconductor device according to another aspect of the invention comprises:
 forming an insulating film on a substrate;
 forming a depression in the insulating film;
 forming a lower-layer film including first and second organic films, an intermediate layer, and a resist film in that order on the insulating film in which the depression is formed; and
 subjecting the resist film to pattern exposure;
 forming the lower-layer film including:
 forming the first organic film on the insulating film in which the depression is formed so that the depression is filled with the first organic film;
 chemically and mechanically polishing the first organic film using a slurry including polymer particles having a surface functional group and a water-soluble polymer to planarize the first organic film; and
 forming the second organic film over the insulating film and the first organic film after the planarization.

A method of manufacturing a semiconductor device according to still another aspect of the invention comprises:
 forming an organic insulating film including an organic material on a substrate;
 stacking first and second hard masks including an inorganic material on the organic insulating film;
 forming a depression in the second hard mask;
 forming a lower-layer film including first and second organic films, an intermediate layer, and a resist film in that order on the second hard mask in which the depression is formed; and
 subjecting the resist film to pattern exposure;
 forming the lower-layer film including:
 forming the first organic film on the second hard mask in which the depression is formed so that the depression is filled with the first organic film;
 chemically and mechanically polishing the first organic film using a slurry including polymer particles having a surface functional group and a water-soluble polymer to planarize the first organic film; and
 forming the second organic film over the second hard mask and the first organic film after the planarization.

A method of manufacturing a semiconductor device according to yet another aspect of the invention comprises:

forming an organic insulating film including an organic material on a substrate;

stacking first, second, and third hard masks including an inorganic material on the organic insulating film;

forming a depression in the third hard mask;

forming a lower-layer film including first and second organic films, an intermediate layer, and a resist film in that order on the third hard mask in which the depression is formed; and subjecting the resist film to pattern exposure;

forming the lower-layer film including:

forming the first organic film on the third hard mask in which the depression is formed so that the depression is filled with the first organic film;

chemically and mechanically polishing the first organic film using a slurry including polymer particles having a surface functional group and a water-soluble polymer to planarize the first organic film; and forming the second organic film over the third hard mask and the first organic film after the planarization.

In the above method of manufacturing a semiconductor device, forming the first organic film may include: applying a material for forming the first organic film; and baking the material at 90 to 160° C.; and the method may further comprise baking the first and second organic films at 250 to 400° C.

In the above method of manufacturing a semiconductor device, the surface functional group may be at least one functional group selected from the group consisting of an anionic functional group, a cationic functional group, an ampholytic functional group, and a nonionic functional group.

In the above method of manufacturing a semiconductor device, the polymer particles may comprise at least one resin selected from the group consisting of an acrylic resin, a polystyrene resin, a urea resin, a melamine resin, a polyacetal resin, a polycarbonate resin, and a composite of these resins.

According to the above chemical mechanical polishing method, the flatness of the organic film can be achieved and occurrence of scratches can be suppressed when chemically and mechanically polishing the organic film using the slurry including the polymer particles having a surface functional group and the water-soluble polymer. As a result, the pattern dimensional variation and the yield can be significantly improved.

According to the above method of manufacturing a semiconductor device, high yield can be achieved by using the method of planarizing an organic film with excellent flatness and few defects.

DETAILED DESCRIPTION OF THE EMBODIMENT

Figure 1:
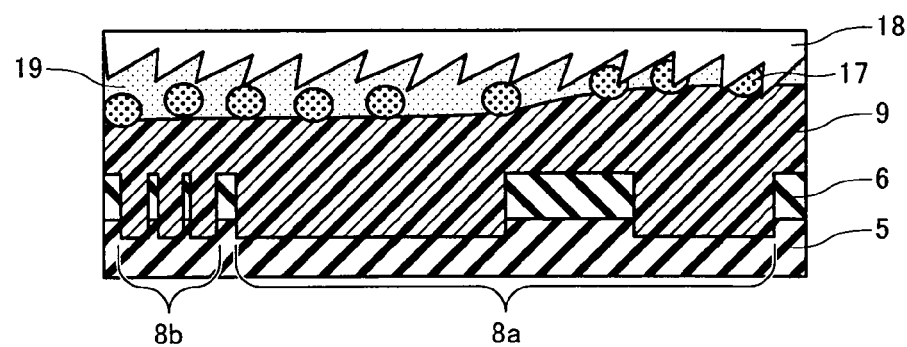
FIG. 1 is a cross-sectional view schematically showing a chemical mechanical polishing method according to one embodiment.

Embodiments of the invention are described with reference to the drawings.

Note that the invention is not limited to the following embodiments. The invention includes various modifications within the spirit and scope of the invention.

1. CHEMICAL MECHANICAL POLISHING METHOD

In one embodiment of the invention, an organic film chemical mechanical polishing slurry (hereinafter called "organic film CMP slurry") is used which includes polymer particles having a surface functional group and a water-soluble polymer. The organic film CMP slurry according to this embodiment is particularly suitably used to manufacture a high-speed device such as a high-speed logic LSI, a system LSI, and an embedded memory logic LSI, for example.

The components and specific examples of the organic film CMP slurry according to this embodiment are described below.

1-1. Polymer Particles Having Surface Functional Group (Hereinafter Called "Polymer Particles")

The polymer particles are particles formed of a resin. The polymer particles may include at least one resin selected from the group consisting of an acrylic resin such as polymethyl methacrylate (PMMA), a polystyrene (PST) resin, a urea resin, a melamine resin, a polyacetal resin, a polycarbonate resin, and a composite of these resins. In particular, it is preferable that the polymer particles include PMMA, PST, or a styrene-acrylic copolymer due to hardness and elasticity suitable for CMP.

In the invention, the polymer particles having a surface functional group may be produced by using an ethylenically unsaturated monomer having a functional group in an amount of 0.1 to 20 wt %, and preferably 1 to 10 wt % of the entire monomers when polymerizing the polymer particles. As examples of the ethylenically unsaturated monomer having a functional group, carboxyl group-containing unsaturated monomers or anhydrides thereof, such as (meth)acrylic acid, itaconic acid, maleic acid, and maleic anhydride; hydroxyalkyl mono(meth)acrylates of a dihydric alcohol such as hydroxymethyl (meth)acrylate and 2-hydroxyethyl (meth) acrylate; free hydroxyl group-containing (meth)acrylates of a polyhydric alcohol with three or more hydroxyl groups such as mono- or di(meth)acrylate of glycerol and mono- or di(meth)acrylate of trimethylolpropane; unsaturated epoxy compounds such as allyl glycidyl ether and glycidyl (meth) acrylate; amides or imides of an unsaturated carboxylic acid such as (meth)acrylamide, N-methoxymethyl(meth)acrylamide, maleic acid amide, and maleimide; N-methylol unsaturated carboxylic acid amides such as N-methylol(meth) acrylamide and N,N-dimethylol(meth)acrylamide; aminoalkyl group-containing acrylamides such as 2-dimethylaminoethylacrylamide, 2-diethylaminoethylacrylamide, and 2-dimethylaminopropylacrylamide; aminoalkyl group-containing (meth)acrylates such as 2-dimethylaminoethyl (meth)acrylate, 2-diethylaminoethyl (meth)acrylate, and 2-dimethylaminopropyl (meth)acrylate; and the like can be given.

Of these compounds, (meth)acrylic acid, 2-hydroxyethyl (meth)acrylate, (meth)acrylamide, and the like are preferable, with (meth)acrylic acid being particularly preferable. These ethylenically unsaturated monomers having a functional group may be used either individually or in combination of two or more.

The polymer particles may have a crosslinked structure. If the polymer particles have a crosslinked structure, the hardness and the elasticity of the particles can be increased, whereby polymer particles more suitable for CMP can be obtained. The polymer particles having a crosslinked structure may be obtained by using a polyfunctional monomer when polymerizing the polymer particles, for example. The term "polyfunctional monomer" used herein refers to a monomer having two or more polymerizable unsaturated bonds. As examples of such a polyfunctional monomer, a divinyl aromatic compound, a polyvalent (meth)acrylate, and the like can be given.

The hardness and the elasticity of the resulting crosslinked polymer particles can be increased by using the polyfunctional monomer in an amount of 1 to 50 wt %, and preferably 5 to 30 wt % of the entire monomers when polymerizing the polymer particles, whereby the polishing rate of an organic film is increased.

Since the polymer particles having a crosslinked structure are insoluble in a solvent, the toluene insoluble content of the polymer particles having a crosslinked structure is 95 wt % or more, and preferably 98 wt % or more. If the toluene insoluble content of the polymer particles is 95 wt % or more, the hardness and the elasticity of the particles can be increased, whereby the polymer particles are more suitable for CMP. The toluene insoluble content is determined by adding 0.3 g of the polymer particles to 100 g of toluene, stirring the mixture at 50° C. for two hours, and measuring the insoluble content of the polymer particles.

At least one functional group selected from an anionic functional group, a cationic functional group, an ampholytic functional group, and a nonionic functional group is introduced into the surface of the polymer particle. As examples of the anionic functional group, a carboxylic acid group, a sulfonic acid group, a sulfate group, a phosphate group, and the like can be given. As examples of the cationic functional group, an amine salt group, a quaternary ammonium salt group, and the like can be given. As examples of the ampholytic functional group, an alkanolamide group, a carboxybetaine group, a glycine group, and the like can be given. As examples of the nonionic functional group, an ether group, an ester group, and the like can be given. A carboxyl group is preferable, since the particles are easily produced.

In the case of a polymer particle having a surface carboxyl group (COOH), the carboxyl group dissociates into $COO^-$ and $H^+$ in the slurry, whereby the surface of the particle is negatively charged. Therefore, aggregation of the particles is prevented due to electrical repulsion, whereby the dispersibility is increased to increase the lifetime. If the carboxyl group exists on the surface of the polymer particle, the dispersibility can be increased without adding a surfactant due to the electrical repulsion between the particles.

It is important to ensure the dispersibility of the particles from the viewpoint of polishing characteristics and storage stability. When the particles are not sufficiently dispersed, scratches may occur due to formation of large particles. Or, the slurry becomes hard (hard cake) to deteriorate in storage stability.

In the invention, it is preferable that the absolute value of the zeta potential be equal to or greater than a specific value in order to more stably disperse the polymer particles. In more detail, it is preferable that the absolute value of the zeta potential be about 20 mV or more.

The amount of carboxyl groups on the surface of the polymer particle is preferably 0.01 mol/kg or more, and still more preferably 0.05 to 1.0 mol/kg.

In the invention, when the average particle diameter of the polymer particles is more than 5 micrometers or less than 10 nanometers, it becomes difficult to control the dispersibility of the particles, whereby the slurry tends to precipitate. In the embodiment of the invention, the average particle diameter of the polymer particles is preferably 10 nanometers or more and 5 micrometers or less, and still more preferably 30 nanometers or more and 500 nanometers or less.

In the organic film CMP slurry according to this embodiment, the concentration of the polymer particles is preferably 0.01 to 10 wt %, more preferably 0.1 to 5 wt %, and still more preferably 0.3 to 3 wt %. If the concentration of the polymer particles is less than 0.01 wt %, the polishing rate may decrease to a large extent. If the concentration of the polymer particles exceeds 10 wt %, dishing may significantly occur.

1-2. Water-Soluble Polymer

The water-soluble polymer included in the organic film CMP slurry according to this embodiment is not particularly limited. As examples of the water-soluble polymer, water-soluble celluloses such as methylcellulose, methylhydroxyethylcellulose, methylhydroxypropylcellulose, hydroxyethylcellulose, hydroxypropylcellulose, carboxymethylcellulose, carboxyethylcellulose, and carboxymethylhydroxyethylcellulose; water-soluble polysaccharides such as chitosan, hyaluronic acid, chondroitin, chondroitin sulfate, chondroitin polysulfate, dermatan sulphate, heparin, keratan sulfate, keratan polysulfate, starch, dextrin, polydextrose, xanthan gum, and guar gum; and water-soluble polymers such as polyethylene glycol, polyethylenimine, polyvinylpyrrolidone, polyvinyl alcohol, polyacrylic acid and its salt, polyacrylamide, and polyethylene oxide can be given. In particular, polyvinyl alcohol and polyvinylpyrrolidone are preferable, because excellent flatness can be obtained. These water-soluble polymers may be used either individually or in combination of two or more.

The molecular weight of the water-soluble polymer is preferably 500 to 1,000,000, more preferably 1,000 to 500,000, and still more preferably 5,000 to 300,000. If the molecular weight of the water-soluble polymer is less than 500, absorption effects may be reduced due to weak interaction with a resist (organic film), whereby dishing may not be suppressed due to a decrease in protection effects. If the molecular weight of the water-soluble polymer exceeds 1,000,000, the polishing rate may be decreased due to an increase in absorption effects. Moreover, it may be difficult to supply the slurry due to a significant increase in viscosity.

In the organic film CMP slurry according to this embodiment, the concentration of the water-soluble polymer is 0.001 to 10 wt %, preferably 0.01 to 1 wt %, and still more preferably 0.05 to 0.5 wt %. If the concentration of the water-soluble polymer is 0.001 wt %, the slurry may not function as a lubricant between a polishing pad and a wafer, whereby a film may be removed or dishing may not be suppressed. If the concentration of the water-soluble polymer exceeds 10 wt %, the polishing rate may be decreased to a large extent due to significant adsorption to the resist (organic film).

1-3. Other Components

The organic film CMP slurry according to this embodiment may include additives such as an oxidizing agent, an organic acid, or a surfactant in an amount generally used.

The pH of the organic film CMP slurry according to this embodiment may be set at 2.0 or more and 8.0 or less. If the pH of the organic film CMP slurry is less than 2.0, the functional group such as COOH rarely dissociates, whereby the dispersibility may deteriorate. If the pH of the organic film CMP slurry exceeds 8.0, chemical damage to the resist (organic film) may be increased, whereby dishing may be increased.

For example, the pH of the organic film CMP slurry according to this embodiment may be adjusted within the above range by appropriately incorporating a pH adjusting agent. As the pH adjusting agent, an inorganic acid (e.g. nitric acid, phosphoric acid, hydrochloric acid, or sulfuric acid), an organic acid (e.g. citric acid), or the like may be used.

1-4. Effects of Chemical Mechanical Polishing Method 1-4-1. Related Art

The effects of the chemical mechanical polishing method according to this embodiment are described below. First, related-art organic film polishing is described for comparison.

In recent years, a damascene interconnect has been mainly utilized to reduce the resistance of the metal interconnect and the wire-to-wire capacitance in a semiconductor integrated circuit device.

A "dual damascene structure" which is formed by collectively processing an interconnect groove and a contact (via) has been employed for the damascene interconnect from the viewpoint of reducing the number of steps and increasing the yield. As the dual damascene structure, a hybrid structure in which two different low-dielectric-constant films are used for the interconnect and the via has been employed from the viewpoint of controllability of the processed shape and the like.

The dual damascene structure using the hybrid structure may be formed using a dual hard mask method or a triple hard mask method using hard masks formed of two or more inorganic films.

When forming a pattern on an underlayer with a depression in such a process, a multilayer resist method, in particular, a three-layer resist method utilizing a lower-layer film, an intermediate layer, and a resist film is widely used. Specifically, the depression in the underlayer is planarized using the lower-layer film and the intermediate layer, and the resist film is then patterned.

In related-art technology, planarization of an organic film (resist) used for the lower-layer film has been used in a "via-first" dual damascene process in which a groove pattern (trench) is formed after forming a hole pattern (via).

In this case, the organic film is polished using a slurry containing only polymer particles. Specifically, since the size of the via hole filled with the organic film is smaller than the size of the polymer particle, the polymer particle does not enter the via hole, whereby an increase in dishing can be suppressed. That is, dishing can be easily suppressed by adjusting the diameter of the polymer particle to be greater than the diameter of the via hole (e.g. JP-A-2004-363191).

In the hybrid dual damascene process, a "trench-mask-first" dual damascene process has been mainly used in which the interconnect groove is processed before processing the via hole (i.e. the trench mask is formed before forming the via pattern).

Figure 2:
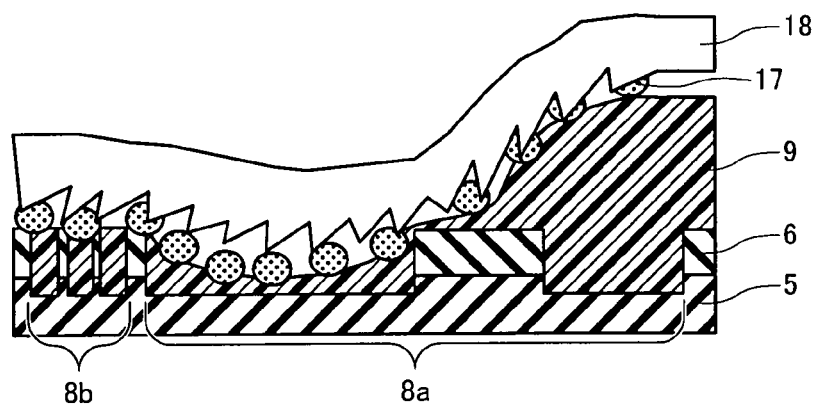
FIG. 2 is a cross-sectional view schematically showing an organic film polishing mechanism using polymer particles according to a known method.

FIG. 2 is a cross-sectional view schematically showing a polishing mechanism when planarizing a first organic film 9 using only polymer particles. A second hard mask 6 is stacked on a first hard mask 5, interconnect groove patterns 8a and 8b are formed in the first and second hard masks 5 and 6, and the first organic film 9 is formed on the first and second hard masks 5 and 6.

The widths of the interconnect groove patterns 8a and 8b are several to several hundred micrometers. As shown in FIG. 2, when planarizing the first organic film 9 provided in the interconnect groove with a width of several to several hundred micrometers using only polymer particles 17, since the width of the groove is greater than the diameter of the polymer particle 17, the polymer particle 17 enters the interconnect groove to increase dishing. As a result, the flatness of the first organic film 9 cannot be achieved, whereby a focus error occurs in the subsequent via pattern lithography step.

As the first organic film 9 used as the lower-layer film, an i-line resist mainly containing a novolac resin which exhibits excellent embedding characteristics (e.g. "IX370G" manufactured by JSR Corporation) or an organic film mainly containing cyclohexanone which exhibits a small process conversion difference and can function as an anti-reflective film for lithography using an ArF excimer laser (e.g. "CT01" manufactured by JSR Corporation) has been widely used.

The hardness of such an organic film changes to a large extent depending on the temperature during baking performed after application. Specifically, crosslinking of the polymer in the organic film proceeds to a greater extent as the baking temperature becomes higher, whereby the hardness of the organic film increases.

In order to reduce dishing of the organic film into the interconnect pattern, the organic film may be thermally cured by baking the organic film at a high temperature of about 300° C. In this case, since the polymer particles used for chemical mechanical polishing generally have hardness significantly lower than the hardness of the organic film (resist), the polishing rate becomes almost zero. Specifically, it is indispensable to bake the organic film at a low temperature of 160° C. or less in order to polish the organic film using a slurry containing polymer particles.

1-4-2. Effects

The chemical mechanical polishing method according to this embodiment includes polishing an organic film using a slurry comprising polymer particles having a surface functional group and a water-soluble polymer.

Dishing of the first organic film 9 into the interconnect pattern can be reduced to 20 nm or less by polishing the first organic film 9 using the slurry comprising the polymer particles having a surface functional group and the water-soluble polymer, whereby the flatness of the first organic film 9 can be significantly improved.

When polishing the first organic film 9 using only the polymer particles in the above-described related art, polishing proceeds while removing the first organic film 9 in a state in which a large frictional force occurs between the polymer particle 17 and the first organic film 9, as shown in FIG. 2.

On the other hand, when polishing the first organic film 9 using the organic film chemical mechanical polishing slurry according to this embodiment, since the water-soluble polymer 19 functions as a lubricant between the first organic film 9 and a polishing pad 18, as shown in FIG. 1, the friction between the particles (polymer particles having a surface functional group) 17 and the first organic film 9 is reduced, whereby the first organic film 9 can be removed stepwise. Moreover, since the water-soluble polymer 19 is adsorbed on the surface of the first organic film 9, the surface of the first organic film 9 can be protected from the particles 17.

As a result, the flatness of the first organic film 9 can be achieved by using the slurry including the polymer particles 17 having a surface functional group and the water-soluble polymer, as shown in Table 1 as Examples 1 to 6 described later. Moreover, occurrence of scratches can be reduced due to the softness of the polymer particles 17 having a surface functional group. Since the polymer particles 17 having a surface functional group are formed of the same material as the resist (first organic film 9), the polymer particles 17 do not serve as an etching mask in the subsequent processing even if the polymer particles 17 remain, differing from the case of using alumina particles as the abrasive particles, whereby problems caused by residual particles can be reduced. As a result, a focus error can be reduced in the subsequent via lithography step, whereby the yield can be significantly increased.

Dishing can be reduced to 20 nm or less by the above-described mechanism even when polishing the first organic film 9 using only the water-soluble polymer, as shown in Table 1 as Comparative Example 3 and Comparative Example 6 described later. However, the polishing rate is significantly decreased. Therefore, it is necessary to use the polymer particles having a surface functional group and the water-soluble polymer in combination in order to achieve a practical polishing rate.

The first organic film may be planarized until the hard mask is exposed outside the interconnect groove pattern. Or, planarization of the first organic film may be stopped in a state in which the first organic film remains on the hard mask outside the interconnect groove pattern. In the latter case, the second organic film may be appropriately formed on the second hard mask through the first organic film.

1-5. Specific Examples of Organic Film CMP Slurry

Specific examples of the organic film CMP slurry and a method of producing the same according to this embodiment are described below. Note that the organic film CMP slurry according to the invention is not limited thereto.

The toluene insoluble content was measured by the following method. Specifically, 0.3 g of the polymer particles were added to 100 g of toluene. The mixture was stirred at 50° C. for two hours, and filtered. The residue (insoluble content) was dried and weighed. The ratio of the weight of the insoluble content after dissolution in toluene to the weight (0.3 g) before adding toluene was taken as the toluene insoluble content.

1-5-1. Slurry 1

A 2-liter flask was charged with 92 parts by weight of styrene, 4 parts by weight of methacrylic acid, 4 parts by weight of hydroxyethyl acrylate, 0.1 part by weight of ammonium lauryl sulfate, 0.5 parts by weight of ammonium persulfate, and 400 parts by weight of ion-exchanged water. After heating the mixture to 70° C. with stirring in a nitrogen gas atmosphere, the mixture was polymerized for six hours. As a result, polystyrene particles (PST particles) with an average particle diameter of 200 nm having a carboxyl group and a hydroxyl group on the surface were obtained. The toluene insoluble content of the resulting PST particles was 10 wt %.

After dispersing the PST particles in pure water to a concentration of 0.83 wt %, 0.16 wt % of polyvinyl alcohol (water-soluble polymer) with a molecular weight of 17,600 was added to the mixture to obtain an organic film CMP slurry 1.

1-5-2. Slurry 2

PST particles with an average particle diameter of 200 nm were obtained using the above-described method. After dispersing the PST particles in pure water to a concentration of 0.83 wt %, 0.16 wt % of polyvinylpyrrolidone (water-soluble polymer) with a molecular weight of 120,000 was added to the mixture to obtain an organic film CMP slurry 2.

1-5-3. Slurry 3

A 2-liter flask was charged with 77 parts by weight of styrene, 3 parts by weight of acrylic acid, 20 parts by weight of divinylbenzene, 2.0 parts by weight of ammonium dodecylbenzenesulfonate, 1.0 part by weight of ammonium persulfate, and 400 parts by weight of ion-exchanged water. After heating the mixture to 70° C. with stirring in a nitrogen gas atmosphere, the mixture was polymerized for six hours. As a result, crosslinked PST particles (crosslinked polymer particles) with an average particle diameter of 50 nm having a carboxyl group on the surface were obtained. The toluene insoluble content of the resulting crosslinked PST particles was 98 wt %.

After dispersing the crosslinked PST particles in pure water to a concentration of 0.83 wt %, 0.16 wt % of polyvinyl alcohol (water-soluble polymer) with a molecular weight of 17,600 was added to the mixture to obtain an organic film CMP slurry 3.

1-5-4. Slurry 4

A 2-liter flask was charged with 35 parts by weight of methyl methacrylate, 35 parts by weight of styrene, 5 parts by weight of methacrylic acid, 25 parts by weight of trimethylolpropane trimethacrylate, 0.5 parts by weight of ammonium dodecylbenzenesulfonate, 0.5 parts by weight of ammonium persulfate, and 400 parts by weight of ion-exchanged water. After heating the mixture to 70° C. with stirring in a nitrogen gas atmosphere, the mixture was polymerized for six hours. As a result, crosslinked styrene acrylic particles (crosslinked polymer particles) with an average particle diameter of 100 nm having a carboxyl group on the surface were obtained. The toluene insoluble content of the resulting crosslinked styrene acrylic particles was 97 wt %.

After dispersing the crosslinked styrene acrylic particles in pure water to a concentration of 1.67 wt %, 0.33 wt % of polyvinyl alcohol (water-soluble polymer) with a molecular weight of 17,600 was added to the mixture to obtain an organic film CMP slurry 4.

2. EXAMPLES

Examples of the invention are described below. Note that the invention is not limited to the following examples. In the following examples, a chemical mechanical polishing method and a method of manufacturing a semiconductor device using the organic film CMP slurry according to this embodiment are described in detail with reference to FIGS. 3 to 11.

2-1. Example 1

This example illustrates a hybrid dual damascene processing method by a dual hard mask method using an ArF excimer laser incorporating planarization of an organic film by CMP.

This example illustrates the case of chemical mechanical polishing the first organic film 9 using the above slurry 1.

Figure 3:
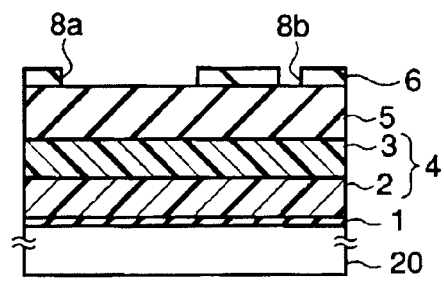
FIG. 3 is a cross-sectional view schematically showing a semiconductor device according to one example of the invention.

As shown in FIG. 3, an organic insulating film 4 and the first and second hard masks 5 and 6 including an inorganic material were formed in that order on a semiconductor substrate 20 on which an element (not shown) was formed. The interconnect groove patterns 8a and 8b as depressions were formed in the second hard mask 6. In the example shown in FIG. 3, the organic insulating film 4 has a two-layer structure formed of a first organic insulating film 2 and a second organic insulating film 3. An etching stopper film 1 is formed in the lower layer of these films.

An interlayer dielectric (not shown) in which a first interconnect layer is formed is provided between the etching stopper film 1 and the semiconductor substrate 20. A silicon oxide film may be used as the interlayer dielectric, for example. The first interconnect layer is formed by providing Cu in the interlayer dielectric through a barrier layer. The etching stopper film 1 also has a function of preventing diffusion of Cu, and may be formed by depositing an SiN film, for example.

The first organic insulating film 2 and the second organic insulating film 3 were formed by depositing SiOC and polyaryl ether (PAE) by plasma enhancement chemical vapor deposition (PE-CVD) and spin coating, respectively. As the material for the organic film, polyaryl ether (FLARE manufactured by AlliedSignal or SiLK manufactured by The Dow Chemical Company), benzocyclobutene (manufactured by The Dow Chemical Company), polyimide, or the like may also be used. The thicknesses of the first and second organic insulating films 2 and 3 are not particularly limited, and may be selected within the range of 50 to 400 nm.

As the material for the organic film formed by CVD, Coral (manufactured by Novellus Systems), Aurora (manufactured by ASM), Black Diamond (manufactured by Applied Materials), and the like are known. As the material for the organic film formed by coating, LKD (manufactured by JSR Corporation), methylsilsesquioxane, and the like are known.

A silane $SiO_2$ film (first hard mask 5) was formed by CVD on the organic insulating film 4 formed of the first and second organic insulating films 2 and 3. An SiN film may be used as the second hard mask 6, for example. The first and second hard masks 5 and 6 may be formed using an arbitrary material. The hard mask may also be formed using a silicon carbide film. The thicknesses of the first and second hard masks 5 and 6 were respectively 160 nm and 50 nm.

After forming a resist pattern (not shown) on the second hard mask 6, the second hard mask 6 was dry-etched using a $CH_2F_2/CF_4/Ar/O_2$ gas to form the interconnect groove patterns 8a and 8b as depressions, as shown in FIG. 3. Although not shown in FIG. 3, since the etch selectivity with the first hard mask 5 cannot be sufficiently achieved when processing the second hard mask 6, the first hard mask 5 was over-etched in an amount of about 10 nm.

The widths of the interconnect groove patterns 8a and 8b were respectively 3000 nm and 90 nm.

Figure 4:
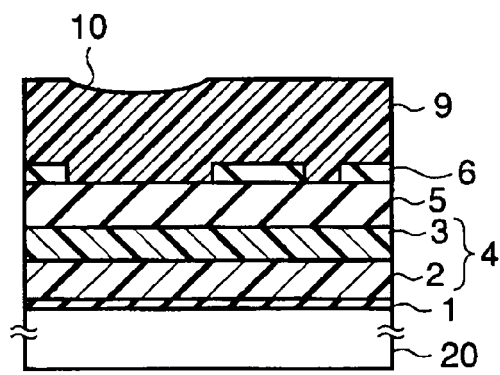
FIG. 4 is a cross-sectional view schematically showing a step subsequent to FIG. 3.

As shown in FIG. 4, the first organic film 9 was formed on the second hard mask 6 in which the interconnect groove patterns 8a and 8b were formed. The bottom surface of the first organic film 9 contacts the first hard mask 5 formed of $SiH_4$ as the raw material. When forming the first organic film 9, a material containing a novolac resin as the main component (resist (IX370G manufactured by JSR Corporation)) was applied to form a coating film with a thickness of 300 nm. The coating film was soft-baked at 130° C. for 60 seconds to obtain the first organic film 9.

An organic film containing a novolac resin as the main component can be easily planarized in comparison with an organic film containing cyclohexanone as the main component (CT01 manufactured by JSR Corporation), for example. An organic film containing a novolac resin as the main component exhibits high adhesion to the first hard mask 5 in comparison with an organic film containing cyclohexanone as the main component, and is relatively rarely removed during CMP. Therefore, it is preferable that the first organic film 9 be an organic film containing a novolac resin as the main component.

The baking temperature is 90 to 160° C. If the baking temperature exceeds 160° C., the resulting first organic film 9 exhibits too high a hardness, whereby it is difficult to polish the first organic film 9 using soft resin abrasives. If the baking temperature is less than 90° C., the resulting first organic film 9 does not function as the lower-layer film due to the residual solvent.

As shown in FIG. 4, a depression 10 due to the interconnect groove pattern 8a was formed in the surface of the first organic film 9. The depth of the depression 10 was about 60 nm. The depth of the depression 10 is greater than the thickness (50 nm) of the second hard mask 6 because the first hard mask 5 was over-etched, as described above.

Figure 5:
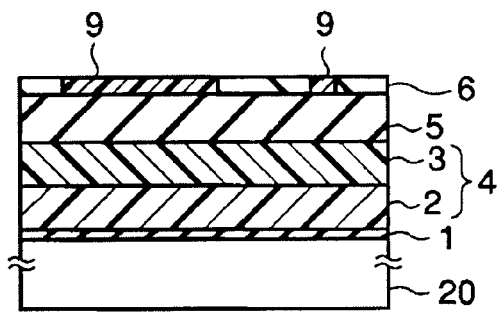
FIG. 5 is a cross-sectional view schematically showing a step subsequent to FIG. 4.
Figure 6:
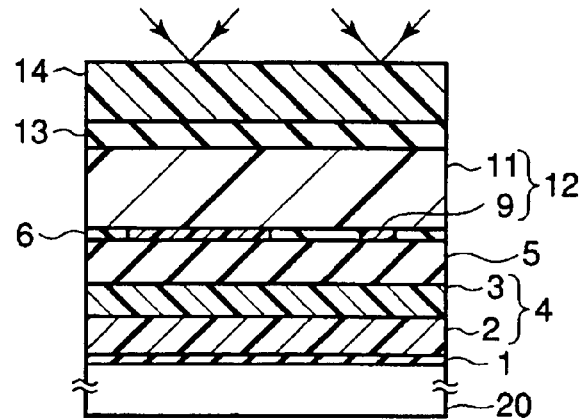
FIG. 6 is a cross-sectional view schematically showing a step subsequent to FIG. 5.

In this example, after planarizing the depression 10 by CMP, as shown in FIG. 5, an organic film (second organic film 11) is deposited to form a lower-layer film 12, as shown in the FIG. 6.

The first organic film 9 was polished using a CMP device (EPO-222 manufactured by Ebara Corporation). A turntable to which a polishing pad was attached was rotated at 30 rpm, and a top ring holding the semiconductor wafer was caused to contact the polishing pad at a load of 100 $gf/cm^2$. As the polishing pad, IC1000/Suba4000 (manufactured by Nitta Haas Incorporated) was used. The top ring was rotated at a rotational speed of 31 rpm. The slurry 1 was supplied onto the polishing pad at a flow rate of 300 cc/min, and the first organic film 9 was polished for 180 seconds. As a result, the flatness could be reduced to 20 nm or less.

When planarizing the first organic film 9, the first organic film 9 need not necessarily be polished until the second hard mask 6 is exposed. The flatness tends to deteriorate after the second hard mask 6 has been exposed (over-polishing) in comparison with case where the first organic film 9 remains on the second hard mask 6 (under-polishing). Specifically, since the hardness (0.4 GPa) of the first organic film 9 is significantly lower than the hardness (18 GPa) of the second hard mask 6 (SiN), dishing tends to proceed due to elastic deformation of a polishing pad.

As shown in FIG. 6, the second organic film (resist) 11 was formed by applying CT01, and baked at 300° C. for 60 seconds to obtain the lower-layer film 12 formed of the first organic film 9 and the second organic film 11. The second organic film 11 was formed to a thickness of 300 nm.

The lithographic performance can be improved by forming the second organic film 11 on the first organic film 9 (i.e. using IX370G (raw material for the first organic film 9) which exhibits excellent embedding characteristics and planarization characteristics and CT01 (raw material for the second organic film 11) which can function as the anti-reflective film during lithography using an ArF excimer laser in combination).

Moreover, since the lower-layer film 12 is baked at 300° C. for 60 seconds after applying the second organic film 11, the etching resistance can be improved by thermal curing in the subsequent etching process.

The baking temperature is preferably 250 to 400° C. If the baking temperature is less than 250° C., thermal curing may be insufficient. If the baking temperature exceeds 400° C., the polymer forming the organic film may be decomposed.

After forming the lower-layer film 12 as described above, a spin on glass (SOG) film as an intermediate layer 13 and a resist film 14 were formed in that order. The thicknesses of the intermediate layer 13 and the resist film 14 were respectively 45 nm and 200 nm.

The resist film 14 was exposed using an ArF excimer laser through an exposure mask having a specific hole pattern.

Figure 7:
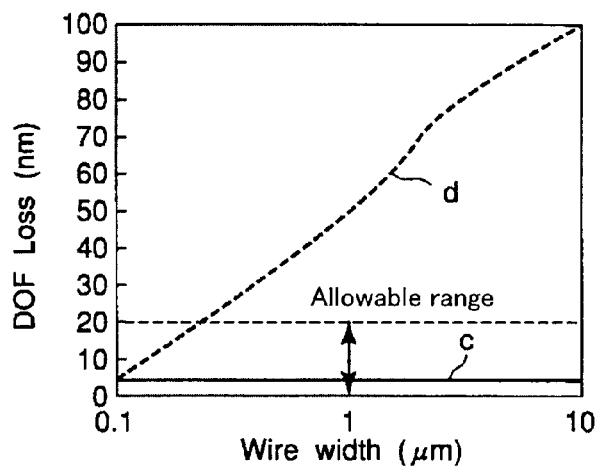
FIG. 7 is graph showing the relationship between the interconnect width and the loss of the depth of focus.

FIG. 7 shows the interconnect width dependence of a focus error during exposure. As indicated by the solid line c in FIG. 7, a focus error when forming a via in the interconnect groove pattern 8a with an interconnect width of 3000 nm was limited to 20 nm or less due to planarization by CMP. According to this example, the pattern dimensional variation can be significantly improved.

Figure 8:
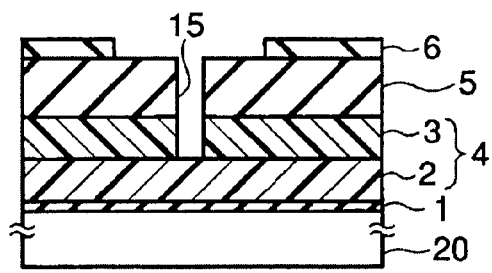
FIG. 8 is a cross-sectional view schematically showing a step subsequent to FIG. 6.

After patterning the intermediate layer 13 and the lower-layer film 12 by dry etching, the resist pattern was removed. A connection hole 15 was formed in the first hard mask 5 by dry etching using the patterned intermediate layer 13 and lower-layer film 12 as a mask. As the etching gas, a $CHF_3/Ar/O_2$ gas was used. The intermediate layer 13 was removed when processing the first hard mask 5. As shown in FIG. 8, the connection hole 15 was formed in the second organic insulating film 3 by dry etching using an $NH_3$ gas. The lower-layer film 12 was removed when processing the second organic insulating film 3.

Figure 9:
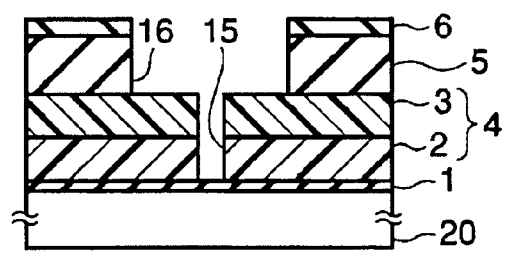
FIG. 9 is a cross-sectional view schematically showing a step subsequent to FIG. 8.
Figure 10:
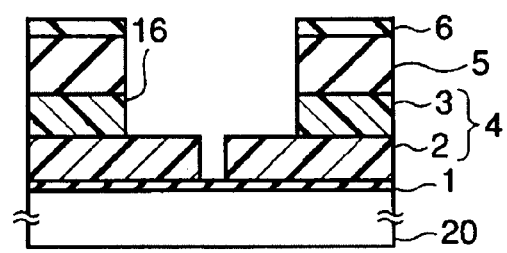
FIG. 10 is a cross-sectional view schematically showing a step subsequent to FIG. 9.

As shown in FIG. 9, an interconnect groove 16 was formed in the first hard mask 5 by dry etching using a $C_5F_8/Ar/O_2$ gas. In this case, the connection hole 15 was formed in the first organic insulating film 2 to reach the etching stopper film 1. As shown in FIG. 10, the interconnect groove 16 was formed in the second organic insulating film 3 by dry etching using an $NH_3$ gas.

Figure 11:
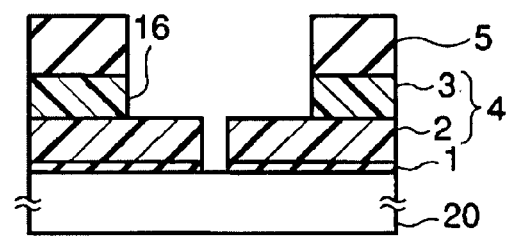
FIG. 11 is a cross-sectional view schematically showing a step subsequent to FIG. 10.

As shown in FIG. 11, the second hard mask 6 was removed using a $CH_2F_2/CF_4/Ar/O_2$ gas. In this case, the etching stopper film 1 at the bottom of the connection hole 15 was also removed.

After forming a barrier layer (not shown) on the inner surfaces of the depressions such as the connection hole 15 and the interconnect groove 16, Cu (not shown) was provided in the depressions. Then, unnecessary Cu film and barrier layer on the silicon oxide film as the first hard mask 5 were removed. A Cu damascene interconnect was thus formed in the depressions to obtain a hybrid dual damascene interconnect.

In this example, the first organic film 9 was planarized by CMP before forming a multilayer structure by forming the second organic film 11 on the first organic film 9. Therefore, the loss of the depth of focus during exposure can be reduced to 20 nm or less, whereby the pattern dimensional variation and the yield could be significantly improved.

In the notation of the interconnect yield shown in Table 1, "S" indicates a yield of 90% or more, "A" indicates a yield of 80% or more, and "B" indicates a yield of 70% or less.

2-2. Comparative Example 1

In this comparative example, a hybrid dual damascene interconnect was formed using a known method in which the lower-layer film is not planarized.

Figure 12:
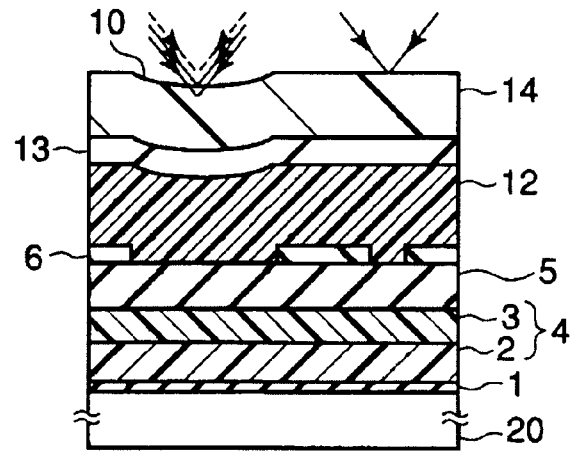
FIG. 12 is a process cross-sectional view schematically showing a method of manufacturing a semiconductor device according to a known method.

After forming the structure shown in FIG. 3 using the above-described method, the lower-layer film 12, the intermediate layer 13 formed of SOG, and the resist film 14 were formed on the second hard mask 6 in that order, as shown in FIG. 12. The second hard mask 6 was formed to a thickness of 50 nm.

The interconnect groove pattern 8a with a width of 3000 nm and the interconnect groove pattern 8b with a width of 90 nm are formed in the second hard mask 6 in the same manner as in Example 1. The lower-layer film 12 was formed in the same manner as in Example 1 except that the first organic film 9 was not planarized.

As shown in FIG. 12, the thickness of the lower-layer film 12 on the interconnect groove pattern 8a with a width of 3000 nm was smaller than the thickness of the lower-layer film 12 on the interconnect groove pattern 8b with a width of 90 nm. The difference in thickness was about 60 nm. This inevitably decreases the depth of focus, and causes a dimensional variation and a decrease in yield.

The resist film 14 was exposed using an ArF excimer laser through a specific exposure mask. The relationship between the width (interconnect width) of the interconnect groove pattern and the loss of the depth of focus is indicated by the broken line d in FIG. 7. The loss of the depth of focus on the interconnect groove pattern (8a) with a width of 3000 nm reached 80 nm, thereby resulting in a focus error.

2-3. Example 2

In this example, hybrid dual damascene processing by a dual hard mask method using an ArF excimer laser incorporating planarization of an organic film by CMP was performed in the same manner as in Example 1.

In this example, the first organic film 9 was chemically and mechanically polished using the above slurry 3.

In more detail, the interconnect groove patterns 8a and 8b were formed in the second hard mask 6 (SiN film) using the method described in Example 1. The first organic film 9 was formed by coating and planarized by CMP.

In this example, the first organic film 9 was planarized using the device, polishing pad, load, and rotational speed described in Example 1 except for using the slurry 3 as the CMP slurry. Specifically, a slurry (slurry 3) was used which was produced by mixing crosslinked PST particles (crosslinked polymer particles) (abrasive) with an average particle diameter of 50 nm, which was smaller than that of the polymer particles used in Example 1, and polyvinyl alcohol (PVA) with a molecular weight of 17,600.

As shown in Table 1, the polishing rate of the organic film could be improved by about four by using the crosslinked PST particles with a small particle diameter. This is considered to be because the hardness of the particles was increased by introducing a crosslinked structure into the polymer particles, and the surface area of the particles contacting the organic film 9 was increased, even if the abrasive concentration was the same, by reducing the particle diameter, whereby the number of effective particles was substantially increased. Moreover, since the depth of one particle entering the organic film 9 was reduced, the progress of dishing after exposing the second hard mask 6 (SiN film) could be suppressed.

After exposing the SiN film, over-polishing was performed for 60 seconds using the slurry 3. As a result, dishing into the interconnect groove pattern 8a with a width of 3000 nm was reduced to less than 10 nm.

Then, CT01 was applied as the second organic film 11 in the same manner as Example 1 to obtain the lower-layer film 12 formed of the first organic film 9 and the second organic film 11. The SOG film as the intermediate layer 13 and the resist film 14 were formed in that order. The thicknesses of the second organic film 11, the intermediate layer 13, and the resist film 14 were the same as in Example 1.

The resist film 14 was exposed using an ArF excimer laser through an exposure mask having a specific hole pattern. In this case, a focus error during via formation on the interconnect groove pattern 8a with a width of 3000 nm was reduced to 10 nm or less due to planarization of the first organic film 9 by CMP. According to this example, the pattern dimensional variation and the yield could be significantly improved.

2-4. Comparative Example 2

In this comparative example, the interconnect groove patterns 8a and 8b were formed in the second hard mask 6 using the method described in Example 1. IX370G was applied as the material for forming the first organic film 9, soft-baked at 130° C. for 60 seconds, and hard-baked at 300° C. for 60 seconds to obtain the first organic film 9.

The first organic film 9 was planarized by CMP. The first organic film 9 was planarized using the device, polishing pad, load, and rotational speed described in Example 1 except for using only PST particles with an average particle diameter of 200 nm as the CMP slurry. The PST particles are particles contained in the slurry 1.

The polishing rate of the first organic film 9 was 1 nm/min or less. The reason therefor is considered to be as follows. Specifically, since the first organic film 9 was thermally cured by hard baking at 300° C. for 60 seconds, the first organic film 9 could not be polished using soft polymer particles (PST particles). As described above, the first organic film 9 could not be planarized using the method of this comparative example. Therefore, it was difficult to reduce a focus error during via lithography, and the yield was not improved.

2-5. Comparative Example 3

In this comparative example, the same operations as in Comparative Example 2 were performed except for using polyvinyl alcohol with a molecular weight of 17,600 as the CMP slurry instead of the PST particles with an average particle diameter of 200 nm.

The polishing rate of the first organic film 9 was 1 nm/min or less in the same manner as in Comparative Example 2. The reason therefor is considered to be as follows. Specifically, since the first organic film 9 was thermally cured by hard baking at 300° C. for 60 seconds, the first organic film 9 could not be polished using the slurry formed of polyvinyl alcohol and containing no abrasive particles. As described above, the first organic film 9 could not be planarized in this comparative example. Therefore, it was difficult to reduce a focus error during lithography, and the yield was not improved. Note that the same results were obtained when polishing the first organic film 9 using a slurry containing PST particles and polyvinyl alcohol.

2-6. Comparative Example 4

In this comparative example, the first organic film 9 was polished in the same manner as in Comparative Example 2 except for using gamma-alumina particles with a primary particle diameter of 30 nm as the CMP slurry instead of the PST particles with an average particle diameter of 200 nm.

The polishing rate of the first organic film 9 was about 300 nm/min, and the flatness was 10 nm or less. Specifically, the first organic film 9 thermally cured by hard baking can be removed using the hard alumina particles with polishing capability. A film with high hardness is advantageous for planarization. Moreover, the particles do not remain in the groove due to the repulsion between the hydrophilic alumina particles and the hydrophobic organic film (first organic film 9), whereby dishing can be suppressed. As a result, a focus error during lithography could be significantly reduced.

On the other hand, scratches caused by the alumina particles reached the hard mask in this comparative example, whereby an abnormal processing shape was obtained. The number of scratches after CMP was measured using an optical inspection device (KLA2129 manufactured by KLA-Tencor Corporation). The number of scratches was 0.34 per $cm^2$ in Example 1, and was 449 per $cm^2$ in this comparative example. Moreover, the abrasives remained on the first organic film 9 and the hard mask and served as a mask in the subsequent etching step to cause an abnormal processing shape, whereby the interconnect yield was decreased.

2-7. Comparative Example 5

In this comparative example, the interconnect groove patterns 8a and 8b were formed in the second hard mask 6 (SiN film) using the method described in Example 1. IX370G was applied and soft-baked at 130° C. for 60 seconds to obtain the first organic film 9.

The first organic film 9 was polished using PST particles with an average particle diameter of 200 nm as the CMP slurry.

The polishing rate was 1 micrometer/min or more. The reason therefor is considered to be as follows. Specifically, since the first organic film 9 was formed by baking at a low temperature (130° C.), the first organic film 9 had a low strength and was brittle, whereby the first organic film 9 could be removed using soft polymer particles (PST particles).

On the other hand, the first organic film 9 obtained by baking at 130° C. was brittle and easily removed, it was difficult to suppress dishing. Therefore, the flatness of the first organic film 9 cannot be achieved. As a result, a focus error during lithography could not be reduced, and the interconnect yield was not improved.

2-8. Comparative Example 8

In this comparative example, the same operations as in Comparative Example 5 were performed except for using polyvinyl alcohol with a molecular weight of 17,600 as the CMP slurry at a concentration of 0.01 wt % instead of the PST particles with an average particle diameter of 200 nm. The polishing rate of the first organic film 9 was as low as about 80 nm/min.

On the other hand, the flatness of the first organic film 9 was as small as 20 nm or less. Specifically, since polyvinyl alcohol functions as a lubricant between the polishing pad and the wafer to reduce friction, the film is not removed. Therefore, more stepwise polishing is realized, and polyvinyl alcohol is adsorbed on the surface of the first organic film 9 to suppress dishing. As a result, a focus error when forming the via was reduced, and the interconnect yield was improved.

However, since only polyvinyl alcohol was used as the slurry in this comparative example, a sufficient polishing rate could not be obtained, whereby productivity was significantly decreased.

2-9. Comparative Example 7

In this comparative example, the same operations as in Comparative Example 5 were performed except for using gamma-alumina particles with a primary particle diameter of 30 nm as the CMP slurry instead of the PST particles with an average particle diameter of 200 nm.

The polishing rate was 1 micrometer/min or more. On the other hand, dishing could not be suppressed for the reason described in Comparative Example 5. In this comparative example, dishing with a depth of 60 nm occurred even in the interconnect groove pattern 8b with a width of 90 nm due to entrance of the alumina particles.

Moreover, the interconnect yield was decreased due to scratches and abrasive residues for the reason described in Comparative Example 4.

2-10. Example 3

In this example, hybrid dual damascene processing was performed by a dual hard mask method using an ArF excimer laser incorporating planarization of an organic film by CMP.

In Example 1, two organic films were used as the lower-layer film 12. In Example 1, the resist containing a novolac resin as the main component (IX370G manufactured by JSR Corporation) was applied to form the first organic film 9. After planarizing the first organic film 9 by CMP, CT01 was applied to form the second organic film 11. This aims at improving the lithographic performance by using IX370G (first organic film 9) which exhibits excellent embedding characteristics and planarization characteristics and CT01 (second organic film 11) which can function as the anti-reflective film during lithography using an ArF excimer laser in combination.

In this example, the organic film 9 containing a novolac resin as the main component (ODL-50 manufactured by JSR Corporation) was used as the lower-layer film 12. ODL-50 exhibits excellent embedding characteristics and planarization characteristics and can function as an anti-reflective film for an ArF excimer laser. Therefore, the lower-layer film 12 exhibiting excellent flatness can be formed by one application and planarization without using two organic films, differing from Example 1. This reduces the number of steps, whereby process cost can be reduced.

In this example, the lower-layer film 12 (organic film 9) was chemically and mechanically polished using the above slurry 2.

The interconnect groove patterns 8a and 8b were formed in the second hard mask 6 (SiN film) using the method described in Example 1. After applying ODL-50 as the first organic film 9, the first organic film 9 was planarized by CMP.

ODL-50 exhibits low adhesion to the hard mask in comparison with IX370G. Therefore, over-etching was performed when forming the groove in the second hard mask 6 in order to suppress removal of the film during CMP, and the interconnect groove pattern was formed so that the depth of the depression in the hard mask was about 100 nm.

The thickness of the organic film 9 may be adjusted by adjusting the viscosity and the rotational speed during spin coating. The coating film was then soft-baked at 130° C. for 60 seconds to obtain the first organic film 9. The baking temperature is preferably 90 to 160° C.

The first organic film 9 was planarized using the device, polishing pad, load, and rotational speed described in Example 1 using the slurry 2 (containing PST particles with an average particle diameter of 200 nm and polyvinylpyrrolidone with a molecular weight of 120,000) as the CMP slurry.

The organic film 9 was removed in an amount of 200 nm, and polishing was stopped without exposing the second hard mask 6 (SiN film). The polishing time was about two minutes. Dishing into the interconnect groove pattern 8a with a width of 3000 nm could be reduced to less than 20 nm. The polishing time required to remove the resist to a desired thickness may be determined (i.e. endpoint detection) by a method of monitoring the torque current of the polishing table or a method of directly measuring the thickness by applying light to the wafer from the back surface of the table.

After hard baking the organic film 9 at 300° C. for 60 seconds without applying the second organic film 11, the SOG film as the intermediate layer 13 and the resist film 14 were directly formed on the organic film 9 in that order. The thicknesses of the intermediate layer 13 and the resist film 14 were the same as in Example 1.

The resist film 14 was then exposed using an ArF excimer laser through an exposure mask having a specific hole pattern. In this case, a focus error during via formation on the interconnect groove pattern 8a with a width of 3000 nm was reduced to 20 nm or less due to planarization of the organic film 9 by CMP. According to this example, the pattern dimensional variation and the yield can be significantly improved.

2-11. Example 4

A method according to this example is described below with reference to FIGS. 13 to 21. In this example, hybrid dual damascene processing was performed by a triple hard mask method using an ArF excimer laser incorporating planarization of an organic film by CMP.

In this example, the first organic film 9 was chemically and mechanically polished using the above slurry 1.

Figure 13:
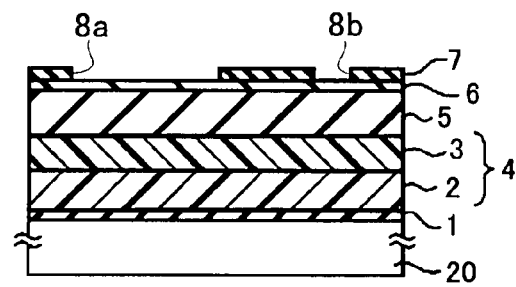
FIG. 13 is a process cross-sectional view schematically showing a method of manufacturing a semiconductor device according to another example of the invention.

As shown in FIG. 13, after forming a first copper interconnect layer (not shown) and the etching stopper film 1 on the semiconductor substrate 20 on which an element (not shown) was formed, the organic insulating film 4 and the first and second hard masks 5 and 6 including an inorganic material were formed in that order. The etching stopper film, the organic insulating film, and the hard masks including an inorganic material may be formed using the materials described in Example 1.

In this example, a silane $SiO_2$ film formed by CVD was used as the first hard mask 5, and an SiN film was used as the second hard mask 6. The thicknesses of the first and second hard masks 5 and 6 were respectively 145 nm and 50 nm. As a third hard mask 7, a TEOS $SiO_2$ film was formed by CVD to a thickness of 50 nm.

After forming a resist pattern (not shown) on the third hard mask 7, the third hard mask 7 was dry-etched using a $C_4F_8$/CO/Ar gas to form the interconnect groove patterns 8a and 8b as depressions, as shown in FIG. 13. The widths of the interconnect groove patterns 8a and 8b were respectively 3000 nm and 90 nm.

According to the triple hard mask method, since the etch selectivity with the second hard mask 6 can be increased when forming the third hard mask 7 by dry etching, the amount of over-etching of the second hard mask 6 can be reduced. Therefore, the depression in the hard mask can be reduced in comparison with the above-described dual hard mask method, whereby a focus error due to the depression during via formation can be suppressed to some extent.

Moreover, the flatness is significantly improved by introducing the organic film CMP according to the invention, whereby a focus error due to the depression in the hard mask can be significantly reduced.

Figure 14:
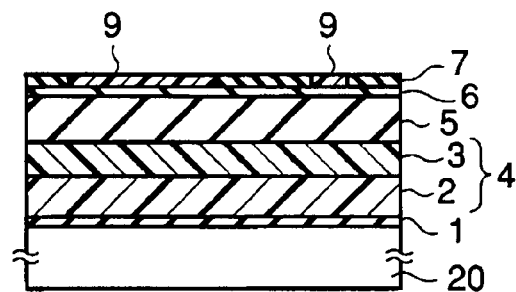
FIG. 14 is a cross-sectional view schematically showing a step subsequent to FIG. 13.

The first organic film 9 was formed by coating after forming the interconnect patterns 8a and 8b, and the first organic film 9 was planarized by CMP, as shown in FIG. 14. When forming the first organic film 9, a resist containing a novolac resin as the main component (IX370G manufactured by JSR Corporation) was applied to form a coating film with a thickness of 300 nm. The coating film was soft-baked at 130° C. for 60 seconds to obtain the first organic film 9.

The first organic film 9 was planarized using the device, polishing pad, load, and rotational speed described in Example 1. In this case, dishing into the interconnect groove pattern 8a with a width of 3000 nm could be reduced to less than 20 nm.

Figure 15:
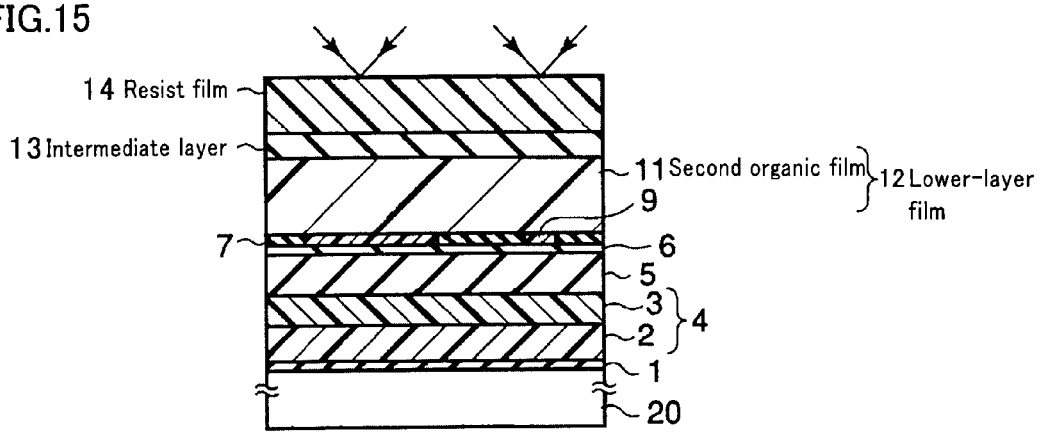
FIG. 15 is a cross-sectional view schematically showing a step subsequent to FIG. 14.

The second organic film 111 was formed by applying CT01 to obtain the lower-layer film 12 formed of the first organic film 9 and the second organic film 11. As shown in FIG. 15, the SOG film as the intermediate layer 13 and the resist film 14 were formed in that order. The second organic film 11 was formed to a thickness of 300 nm. The thicknesses of the intermediate layer 13 and the resist film 14 were respectively 45 nm and 200 nm.

The resist film 14 was exposed using an ArF excimer laser. In this case, the loss of the depth of focus during via formation on the interconnect groove pattern 8a with a width of 3000 nm and the interconnect groove pattern 8b with a width of 90 nm was reduced to 20 nm or less due to planarization by CMP, whereby a focus error could be reduced.

Figure 16:
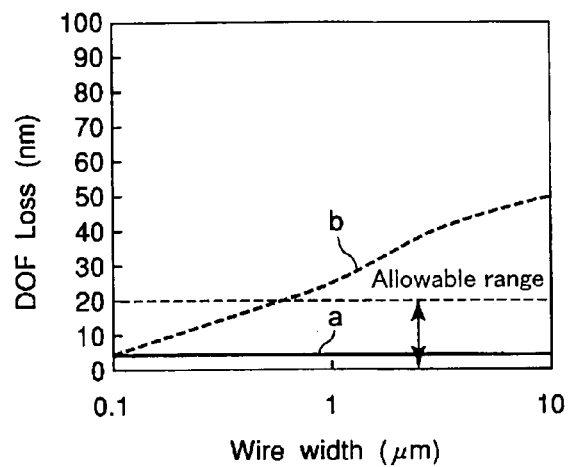
FIG. 16 is graph showing the relationship between the interconnect width and the loss of the depth of focus.

The graph in FIG. 16 shows the relationship between the interconnect width and the loss of the depth of focus (focus error). The results of this example are indicated by the solid line a. As is clear from FIG. 16, the loss of the depth of focus is almost constant irrespective of the interconnect width. According to this example, the pattern dimensional variation and the yield can be significantly improved. The broken line b in FIG. 16 indicates the case of exposing a resist film formed using a known method, which is described later.

The resist film 14 after exposure was developed using a developer to obtain a resist pattern (not shown). The intermediate layer 13 was processed with a $CHF_3/O_2$ gas using the resist pattern as an etching mask. The lower-layer film 12 was processed with an $NH_3/O_2/CH_4$ gas, and the resist pattern was removed by $O_2$ ashing.

Figure 17:
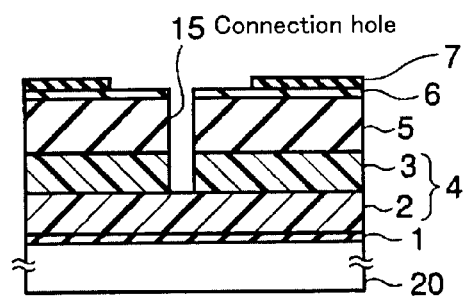
FIG. 17 is a cross-sectional view schematically showing a step subsequent to FIG. 15.

The second hard mask 6 and the first hard mask 5 were dry-etched using the patterned intermediate layer 13 and lower-layer film 12 (not shown) as a mask to form the connection hole 15, as shown in FIG. 17. As the etching gas, a $CHF_3/Ar/O_2$ gas was used. The intermediate layer 13 was removed when processing the first hard mask 5. The connection hole 15 was formed in the second organic insulating film 3 by dry etching using an $NH_3$ gas. The lower-layer film 12 was removed when processing the second organic insulating film 3.

Figure 18:
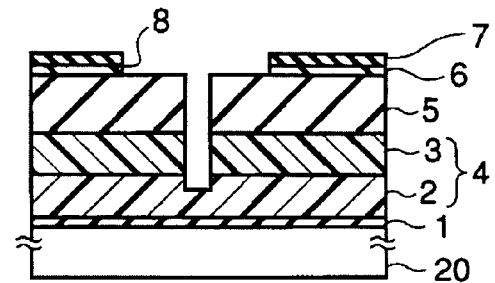
FIG. 18 is a cross-sectional view schematically showing a step subsequent to FIG. 17.
Figure 19:
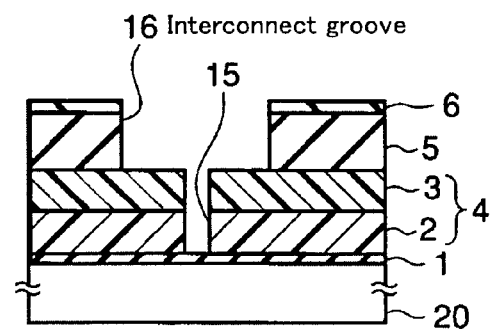
FIG. 19 is a cross-sectional view schematically showing a step subsequent to FIG. 18.

As shown in FIG. 18, the interconnect groove pattern 8 was formed in the second hard mask 6 by dry etching using a $CH_2F_2/CF_4/Ar/O_2$ gas. As shown in FIG. 18, the connection hole 15 was formed to reach the middle of the first organic insulating film 2. The third hard mask 7 was removed using a $C_5F_8/Ar/O_2$ gas, and the interconnect groove 16 was formed in the first hard mask 5, as shown in FIG. 19. In this case, the connection hole 15 reached the etching stopper film 1. The connection hole 15 was thus formed in the first organic insulating film 2 by the two-stage process. This is advantageous in that the connection hole 15 can be reliably formed through the film, which is the advantage of the triple hard mask method.

Figure 20:
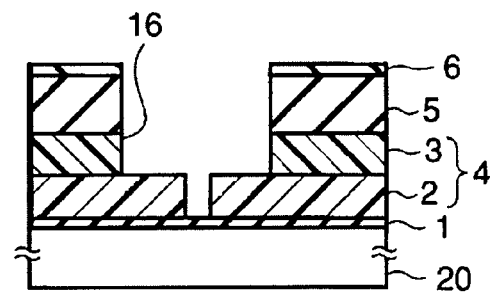
FIG. 20 is a cross-sectional view schematically showing a step subsequent to FIG. 19.
Figure 21:
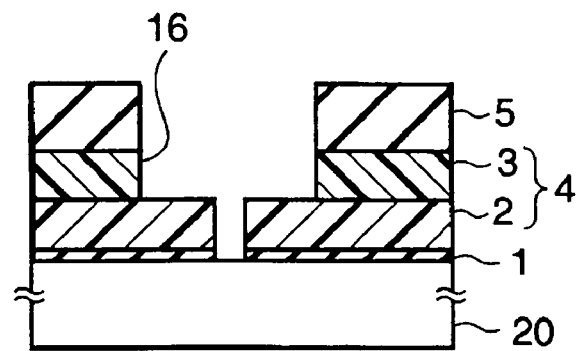
FIG. 21 is a cross-sectional view schematically showing a step subsequent to FIG. 20.

As shown in FIG. 20, the interconnect groove 16 was formed in the second organic insulating film 3 by dry etching using an $NH_3$ gas. As shown in FIG. 21, the second hard mask 6 was removed using a $CH_2F_2/CF_4/Ar/O_2$ gas. In this case, the etching stopper film 1 at the bottom of the connection hole 15 was also removed.

After forming a barrier layer (not shown) on the inner surfaces of the depressions such as the connection hole 15 and the interconnect groove 16, Cu (not shown) was provided in the depressions. Then, unnecessary Cu film and barrier layer on the silicon oxide film as the first hard mask 5 were removed. A Cu damascene interconnect was thus formed in the depressions to obtain a hybrid dual damascene interconnect.

In this example, the first organic film 9 is planarized by CMP before forming a multilayer structure by forming the second organic film 11 on the first organic film 9. As a result, the loss of the depth of focus during exposure can be reduced to 20 nm or less according to this example, whereby the pattern dimensional variation and the yield could be significantly improved.

2-12. Comparative Example 8

In this comparative example, a hybrid dual damascene interconnect was formed using a known method in which the lower-layer film is not planarized.

Figure 22:
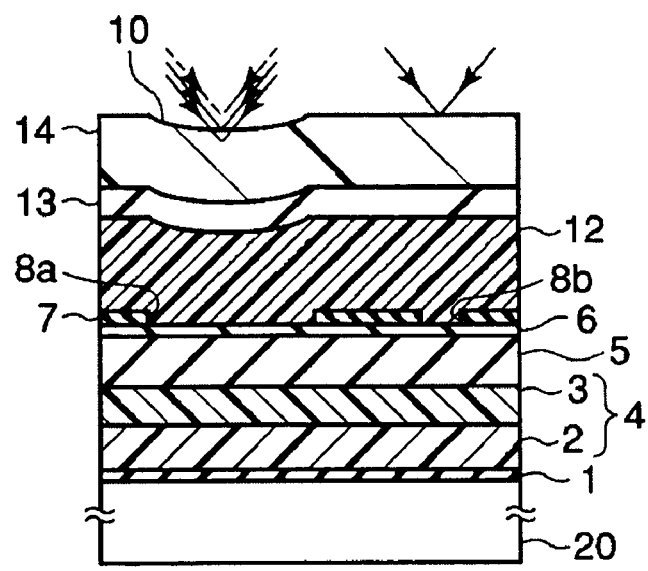
FIG. 22 is a cross-sectional view schematically showing a method of manufacturing a semiconductor device according to a known method.

After forming the structure shown in FIG. 13 using the above-described method, the lower-layer film 12, the intermediate layer 13 formed of SOG, and the resist film 14 were formed on the third hard mask 7 in that order, as shown in FIG. 22. The interconnect groove pattern 8a with a width of 3000 nm and the interconnect groove pattern 8b with a width of 90 nm are formed in the third hard mask 7 in the same manner as described above. The lower-layer film 12 is the first organic film 9 deposited on the third hard mask 7. The lower-layer film 12 was formed without planarization. The thickness of the lower-layer film 12 was 300 nm. When the lower-layer film 12 has such a small thickness, the depression in the hard mask cannot be reduced.

As shown in FIG. 22, the thickness of the lower-layer film 12 on the interconnect groove pattern 8a with a width of 3000 nm was smaller than the thickness of the lower-layer film 12 on the interconnect groove pattern 8b with a width of 90 nm. The difference in thickness was about 40 nm. This inevitably decreases the depth of focus, and causes a dimensional variation and a decrease in yield.

The resist film 14 was then exposed using an ArF excimer laser through a specific exposure mask. The relationship between the width (interconnect width) of the interconnect groove pattern and the loss of the depth of focus is indicated by the broken line b in FIG. 16. The loss of the depth of focus in the interconnect groove pattern 8a with a width of 3000 nm was 40 nm.

2-13. Example 5

In this example, hybrid dual damascene processing was performed by a triple hard mask method using an ArF excimer laser incorporating planarization of an organic film by CMP.

In this example, the first organic film 9 was chemically and mechanically polished using the above slurry 4.

After forming the interconnect groove patterns 8a and 8b in the third hard mask 7 using the method described in Example 4, the first organic film 9 was formed by coating and planarized by CMP.

In this example, the first organic film 9 was planarized using the device, polishing pad, load, and rotational speed described in Example 1 except for using the slurry 4 as the CMP slurry. Specifically, a slurry produced by dispersing the crosslinked styrene acrylic particles in pure water at a concentration of 1.67 wt % and adding 0.33 wt % of polyvinyl alcohol with a molecular weight of 17,600 to the mixture was used as the CMP slurry in this example.

In this example, the first organic film 9 was polished using the slurry 4 until the third hard mask 7 (SiN film) was exposed. As a result, dishing into the interconnect groove pattern 8a with a width of 3000 nm could be reduced to less than 10 nm.

Then, CT01 was applied as the second organic film 11 in the same manner as Example 1 to obtain the lower-layer film 12 formed of the first organic film 9 and the second organic film 11. The SOG film as the intermediate layer 13 and the resist film 14 were formed in that order. The thicknesses of the second organic film 11, the intermediate layer 13, and the resist film 14 were the same as in Example 1.

The resist film 14 was then exposed using an ArF excimer laser through an exposure mask having a specific hole pattern. In this case, a focus error during via formation on the interconnect groove pattern 8a with a width of 3000 nm was limited to 20 nm or less due to planarization by CMP. As a result, the pattern dimensional variation and the yield can be significantly improved.

2-14. Example 6

In this example, hybrid dual damascene processing was performed by a triple hard mask method using an ArF excimer laser incorporating planarization of an organic film by CMP.

After forming the interconnect groove patterns 8a and 8b in the third hard mask 7 using the method described in Example 4, the first organic film 9 was formed by coating and planarized by CMP.

The first organic film 9 was planarized using the device, polishing pad, load, and rotational speed described in Example 1. In this example, PST particles with an average particle diameter of 200 nm and polyvinyl alcohol with a molecular weight of 17,600 were used as the CMP slurry. The PST particles and polyvinyl alcohol were mixed on the polishing pad and used for polishing.

In a normal CMP process, after polishing using a slurry, polishing (water polishing) using pure water is performed for several to several ten seconds in order to remove the slurry, polishing dust, and the like adhering to the polishing pad and the wafer surface. However, since an organic film baked at a low temperature is very brittle, the organic film is polished during water polishing, whereby dishing is increased. Therefore, in CMP of an organic film baked at a low temperature, it is preferable not to perform water polishing from the viewpoint of ensuring flatness.

On the other hand, when water polishing is not performed, it is necessary to remove the slurry, polishing dust, and the like adhering to the polishing pad and the wafer surface, as described above. When using polymer particles as abrasive particles, polishing dust of the organic film and the polymer particles remaining on the organic film are removed in the subsequent etching step or ashing step. However, such residual dust may cause cracks in the coating step of the second organic film 11 immediately after CMP or the coating step of SOG in the above-described example.

In this case, it is effective to perform polishing using high-concentration polyvinyl alcohol instead of water polishing after polishing using the slurry in order to remove residual dust. Specifically, since polyvinyl alcohol protects the surface of the organic film, polyvinyl alcohol can suppress the progress of dishing. Moreover, since polyvinyl alcohol exhibits washing effects, polyvinyl alcohol is effective for removing residual dust.

In this example, in order to polish the first organic film 9 using the slurry, a 1 wt % aqueous solution (1) of the PST particles with an average particle diameter of 200 nm contained in the slurry 1 and a 1 wt % aqueous solution (2) of polyvinylpyrrolidone with a molecular weight of 17,600 were mixed on the polishing pad. The flow rates of the aqueous solutions (1) and (2) were respectively 250 cc/min and 50 cc/min. The first organic film 9 was polished using the same polishing pressure and rotational speed as in Example 1. The polishing rate of the first organic film 9 was 100 nm/min. The polishing rate can be easily controlled by the concentrations, flow rate, flow rate ratio, molecular weight, material, and the like of the polymer particles and the water-soluble polymer. The first organic film 9 with a thickness of 300 nm was polished for three minutes under the above conditions.

After stopping the supply of the aqueous solution (1), the first organic film 9 was polished for 20 seconds at a flow rate of 300 cc/min using the aqueous solution (2). Dishing progressed to only a small extent during this operation.

As a result, residual dust can be significantly reduced, and the flatness of the first organic film 9 can be achieved.

Then, CT01 was applied as the second organic film 11 in the same manner as Example 1 to obtain the lower-layer film 12 formed of the first organic film 9 and the second organic film 11. The SOG film as the intermediate layer 13 and the resist film 14 were formed in that order. The thicknesses of the second organic film 11, the intermediate layer 13, and the resist film 14 were the same as in Example 1.

The resist film 14 was exposed using an ArF excimer laser through an exposure mask having a specific hole pattern. In this case, a focus error during via formation on the interconnect groove pattern 8a with a width of 3000 nm was reduced to 20 nm or less due to planarization by CMP. According to this example, the pattern dimensional variation and the yield could be significantly improved.

TABLE 1

| | | | | | | First organic film | | |
|---|---|---|---|---|---|---|---|---|
| | | | | | | | Flatness | |
| | | Hard mask structure | Type | Baking temperature | CMP | Slurry | Polishing rate of organic film | 90 nm | 3000 nm |
| Example 1 | Dual | IX370G | 130° C. | Conducted | Slurry 1 | 100 nm/min | <10 nm | <20 nm |
| Example 2 | Dual | IX370G | 130° C. | Conducted | Slurry 3 | 400 nm/min | <10 nm | <10 nm |
| Example 3 | Dual | OLD-50 | 130° C. | Conducted | Slurry 2 | 100 nm/min | <10 nm | <20 nm |
| Example 4 | Triple | IX370G | 130° C. | Conducted | Slurry 1 | 100 nm/min | <10 nm | <20 nm |
| Example 5 | Triple | IX370G | 130° C. | Conducted | Slurry 4 | 200 nm/min | <10 nm | <20 nm |

TABLE 1-continued

| | | | | | | | | |
|---|---|---|---|---|---|---|---|---|
| Example 6 | Triple | IX370G | 130° C. | Conducted | PST particles and PVA were mixed on table | 100 nm/min | <10 nm | <20 nm |
| Comparative Example 1 | Dual | CT01 | 300° C. | None | — | — | <10 nm | 60 nm |
| Comparative Example 2 | Dual | IX370G | 300° C. | Conducted | PST particles | <1 nm/min | <10 nm | 60 nm |
| Comparative Example 3 | Dual | IX370G | 300° C. | Conducted | PVA | <1 nm/min | <10 nm | 60 nm |
| Comparative Example 4 | Dual | IX370G | 300° C. | Conducted | Alumina particles | 300 nm/min | <10 nm | <10 nm |
| Comparative Example 5 | Dual | IX370G | 130° C. | Conducted | PST particles | >1 μm/min | <10 nm | 60 nm |
| Comparative Example 6 | Dual | IX370G | 130° C. | Conducted | PVA | 80 nm/min | <10 nm | <20 nm |
| Comparative Example 7 | Dual | IX370G | 130° C. | Conducted | Alumina particles | >1 μm/min | 60 nm | 60 nm |
| Comparative Example 8 | Triple | CT01 | 300° C. | None | — | — | <10 nm | 40 nm |

| | First organic film | | Second organic film | | Focus error during via lithography (on 3000-nm interconnect) | Interconnect yield |
|---|---|---|---|---|---|---|
| | Scratch | Problems due to abrasive residue | Type | Baking temperature | | |
| Example 1 | Few | None | CT101 | 300° C. | <20 nm | A |
| Example 2 | Few | None | CT101 | 300° C. | <10 nm | A |
| Example 3 | Few | None | — | — | <20 nm | A |
| Example 4 | Few | None | CT101 | 300° C. | <20 nm | S |
| Example 5 | Few | None | CT101 | 300° C. | <20 nm | S |
| Example 6 | Few | None | CT101 | 300° C. | <20 nm | S |
| Comparative Example 1 | None | None | — | — | 60 nm | B |
| Comparative Example 2 | Few | Few | CT101 | 300° C. | 60 nm | B |
| Comparative Example 3 | Few | None | CT101 | 300° C. | 60 nm | B |
| Comparative Example 4 | Many | Many | CT101 | 300° C. | <10 nm | B |
| Comparative Example 5 | Few | Few | CT101 | 300° C. | 60 nm | B |
| Comparative Example 6 | Few | None | CT101 | 300° C. | <20 nm | A |
| Comparative Example 7 | Many | Many | CT101 | 300° C. | 60 nm | B |
| Comparative Example 8 | None | None | — | — | 40 nm | A |

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A method of manufacturing a semiconductor device comprising:
   forming an insulating film on a substrate;
   forming a hollow portion in the insulating film;
   forming a lower-layer film, an intermediate layer, and a resist film in that order on the insulating film in which the hollow portion has been formed;
   subjecting the resist film to pattern exposure;
   wherein the forming the lower-layer film comprises:
   forming an organic film on the insulating film in which the hollow portion is formed by applying a material comprising a novolac resin as a main component so that the hollow portion is filled with the organic film and baking the material at a temperature between 90 and 160° C.; and
   chemically and mechanically polishing the organic film using a slurry comprising polymer particles having a surface functional group and a water soluble polymer to planarize the organic film.

2. The method of manufacturing a semiconductor device according to claim 1,
   wherein the surface functional group is at least one functional group selected from the group consisting of an anionic functional group, a cationic functional group, an ampholytic functional group, and a nonionic functional group.

3. The method of manufacturing a semiconductor device according to claim 1,
   wherein the polymer particles comprise at least one resin selected from the group consisting of an acrylic resin, a polystyrene resin, a urea resin, a melamine resin, a polyacetal resin, a polycarbonate resin, and a composite thereof.

4. A method of manufacturing a semiconductor device comprising:
- forming an insulating film on a substrate;
- forming a hollow portion in the insulating film;
- forming a lower-layer film comprising first and second organic films, an intermediate layer, and a resist film in that order on the insulating film in which the hollow portion has been formed;
- subjecting the resist film to pattern exposure;
- wherein the forming the lower-layer film comprises:
- forming the first organic film on the insulating film in which the hollow portion is formed by applying a material comprising a novolac resin as a main component so that the hollow portion is filled with the first organic film and baking the material at a temperature between 90 and 160° C.; and
- chemically and mechanically polishing the first organic film using a slurry comprising polymer particles having a surface functional group and a water soluble polymer to planarize the first organic film; and
- forming the second organic film over the insulating film and the first organic film after the planarization.

5. The method of manufacturing a semiconductor device according to claim 4,
- wherein the method further comprises baking the first and second organic films at a second temperature between 250 and 400° C.

6. The method of manufacturing a semiconductor device according to claim 4,
- wherein the surface functional group is at least one functional group selected from the group consisting of an anionic functional group, a cationic functional group, an ampholytic functional group, and a nonionic functional group.

7. The method of manufacturing a semiconductor device according to claim 4,
- wherein the polymer particles comprise at least one resin selected from the group consisting of an acrylic resin, a polystyrene resin, a urea resin, a melamine resin, a polyacetal resin, a polycarbonate resin, and a composite thereof.

8. A method of manufacturing a semiconductor device comprising:
- forming an organic insulating film comprising an organic material on a substrate;
- stacking first and second hard masks comprising an inorganic material on the organic insulating film;
- forming a hollow portion in the second hard mask;
- forming a lower-layer film comprising first and second organic films, an intermediate layer, and a resist film in that order on the second hard mask in which the hollow portion has been formed;
- subjecting the resist film to pattern exposure;
- wherein the forming the lower-layer film comprises:
- forming the first organic film on the second hard mask in which the hollow portion is formed by applying a material comprising a novolac resin as a main component so that the hollow portion is filled with the first organic film and baking the material at a temperature between 90 and 160° C.; and
- chemically and mechanically polishing the first organic film using a slurry comprising polymer particles having a surface functional group and a water soluble polymer to planarize the first organic film; and
- forming the second organic film over the second hard mask and the first organic film after the planarization.

9. The method of manufacturing a semiconductor device according to claim 8,
- wherein the method further comprises baking the first and second organic films at a second temperature between 250 and 400° C.

10. The method of manufacturing a semiconductor device according to claim 8,
- wherein the surface functional group is at least one functional group selected from the group consisting of an anionic functional group, a cationic functional group, an ampholytic functional group, and a nonionic functional group.

11. The method of manufacturing a semiconductor device according to claim 8,
- wherein the polymer particles comprise at least one resin selected from the group consisting of an acrylic resin, a polystyrene resin, a urea resin, a melamine resin, a polyacetal resin, a polycarbonate resin, and a composite thereof.

12. A method of manufacturing a semiconductor device comprising:
- forming an organic insulating film comprising an organic material on a substrate;
- stacking first, second, and third hard masks comprising an inorganic material on the organic insulating film;
- forming a hollow portion in the third hard mask;
- forming a lower-layer film comprising first and second organic films, an intermediate layer, and a resist film in that order on the third hard mask in which the hollow portion has been formed;
- subjecting the resist film to pattern exposure;
- wherein the forming the lower-layer film comprises:
- forming the first organic film on the third hard mask in which the hollow portion is formed by applying a material comprising a novolac resin as a main component so that the hollow portion is filled with the first organic film and baking the material at a temperature between 90 and 160° C.; and
- chemically and mechanically polishing the first organic film using a slurry comprising polymer particles having a surface functional group and a water soluble polymer to planarize the first organic film; and
- forming the second organic film over the third hard mask and the first organic film after the planarization.

13. The method of manufacturing a semiconductor device according to claim 12,
- wherein the method further comprises baking the first and second organic films at a second temperature between 250 and 400° C.

14. The method of manufacturing a semiconductor device according to claim 12,
- wherein the surface functional group is at least one functional group selected from the group consisting of an anionic functional group, a cationic functional group, an ampholytic functional group, and a nonionic functional group.

15. The method of manufacturing a semiconductor device according to claim 12,
- wherein the polymer particles comprise at least one resin selected from the group consisting of an acrylic resin, a polystyrene resin, a urea resin, a melamine resin, a polyacetal resin, a polycarbonate resin, and a composite thereof.

* * * * *